United States Patent [19]

Brambilla et al.

[11] Patent Number: 5,894,065
[45] Date of Patent: Apr. 13, 1999

[54] METHOD FOR IMPROVING THE INTERMEDIATE DIELECTRIC PROFILE, PARTICULARLY FOR NON-VOLATILE MEMORIES

[75] Inventors: Claudio Brambilla, Concorezzo; Giancarlo Ginami, Bergamo; Stefano Daffra, Milan; Andrea Ravaglia, Olgiate Molgora; Manlio Sergio Cereda, Lomagna, all of Italy

[73] Assignee: SGS-Thomson Microelectronics S.r.l., Agrate Brianza, Italy

[21] Appl. No.: 08/802,619

[22] Filed: Feb. 19, 1997

[30] Foreign Application Priority Data

Feb. 28, 1996 [EP] European Pat. Off. .............. 96830086

[51] Int. Cl.⁶ .................................................. H01L 21/336
[52] U.S. Cl. .................................................. 438/265
[58] Field of Search .................................. 438/257, 258, 438/259, 260, 261, 262, 263, 264, 265, 266, 267

[56] References Cited

U.S. PATENT DOCUMENTS 5,087,584  2/1992  Wada et al. .............................. 438/263
5,256,584  10/1993  Hartmann ................................ 437/43
5,330,924  7/1994  Huang ................................... 438/258

OTHER PUBLICATIONS

European Search Report from European Patent Application 96830086.3, filed Feb. 28, 1996.

*Primary Examiner*—Brian Dutton
*Attorney, Agent, or Firm*—Wolf, Greenfield & Sacks, P.C.

[57] ABSTRACT

A method for improving the intermediate dielectric profile, particularly for non-volatile memories constituted by a plurality of cells, including the following steps: forming field oxide regions and drain active area regions on a substrate; forming word lines on the field oxide regions; depositing oxide to form oxide wings that are adjacent to the word lines; opening, by masking, source regions and the drain active area regions, keeping the field oxide regions that separate one memory cell from the other, inside the memory, covered with resist; and removing field oxide in the source regions and removing oxide wings from both sides of the word lines.

5 Claims, 4 Drawing Sheets

METHOD FOR IMPROVING THE INTERMEDIATE DIELECTRIC PROFILE, PARTICULARLY FOR NON-VOLATILE MEMORIES

BACKGROUND OF THE INVENTION

1. Field of the Invention

The present invention relates to a method for improving the intermediate dielectric profile, particularly for non-volatile memories such as EPROMs and FLASH memories.

2. Discussion of the Related Art

The gradual reduction in the size of chips allows an increasingly larger number of devices to be located on each individual silicon wafer, with a consequent reduction in production costs.

In reducing memory size more and more, an increasingly important role is played by the space occupied by each individual memory cell, which is repeated in an array millions of times in a matrix until the desired memory capacity is reached.

The ever greater size reduction, on the other hand, causes many problems in the connection and continuity of the metal lines. Elevation differences in the devices and size reduction (reduction in the size of the contacts and of the metal lines, reduction in the distances between the contact and the gate terminal of the cell and of the distances between metal lines) can cause elevation differences that are difficult to span adequately with the interconnecting metal layers.

In order to improve contact formation, deposition methods (doped dielectrics) and reflow methods, i.e., thermal treatments for redistributing the dielectric and thus "soften" the elevation differences, have been developed.

The method normally used to produce memories entails the use of memory cells with implantations that are self-aligned with respect to the gate terminal of the cell, in order to ensure the electrical performance (writing of the memory cell), and transistors, with structures of the LDD (Low Doped Drain) type, used to relax the electrical fields.

A method that is currently used to provide LDD structures is the generation of wings made of oxide, generally termed oxide "spacers", that are formed by means of a process for depositing a non-doped dielectric and with an RIE etching (anisotropic etching in plasma) that leaves an oxide residue at the sides of the transistor gates.

Light implantations are performed before generating the oxide spacers, while heavy source/drain implantations, self-aligned with the spacers, are performed; the two implantations are of the same type: phosphor (light) and arsenic (heavy) for the N-channel transistors, and low-dose boron (light) and high-dose boron (heavy) for P-channel transistors.

FIG. 3 is a sectional view of a memory cell, of an N-channel transistor, and of a P-channel transistor. In particular, the element on the left in the figure is the memory cell, the central element is the N-channel transistor, and the element on the right is the P-channel transistor.

In detail, the reference numeral 1 designates the N-type substrate, the reference numeral 2 designates the N-type well, the reference numeral 3 designates the gate oxide layer, and the reference numeral 4 designates the layer of oxide present between the two layers of conducting polysilicon 11 and 12 of the memory cell. The polysilicon layer 12 is the control gate terminal of both the memory cell and the transistors, whereas the polysilicon layer 11 is the floating gate terminal in which charge accumulation occurs.

Between one device and the next (memory cell—N-type transistor—P-type transistor) there is provided a layer of field oxide 5 that acts as an insulator. A junction 6 is present, for the memory cell, adjacent to the field oxide 5 and is self-aligned with the gate terminal of the cell.

Likewise, adjacent to the transistors (N and P) there are provided light implantations of the LDD type, designated respectively by the reference numerals 7 and 10 for the N-channel transistors and for the P-channel transistors, as well as source/drain junctions that are self-aligned with the oxide wings 13 of the devices and are designated by the reference numerals 8 and 9 respectively.

The oxide wings, i.e., the spacers, are designated by the reference numeral 13.

A method known as SAS (Self Align Source) is currently used to selectively remove the spacers 13 on the source terminal side. In order to better understand the differences of the known SAS method with respect to the conventional method for producing memory cells, it is convenient to describe the two methods side by side, in order to point out their drawbacks that cause the need for a new solution to the problem.

FIGS. 1 and 4 show, for the standard process and for the SAS process, the first step of the process, which in one case (standard process, FIG. 1) consists in forming the region of the source line by means of an appropriate mask and in the other case (SAS method, FIG. 4) consists in forming the active drain area regions. In this manner, in the second case bands of active drain area 15 and bands of field oxide 14 (which is insulating, previously designated in FIG. 3 with the reference numeral 5) are obtained, that run uninterruptedly along the entire length of the matrix.

Then the word lines 16 are formed by means of the mask for the deposition of polysilicon.

A heavy doping implantation of the drain and source areas of the cells is then performed for both processes.

Then a step of oxide deposition (formation of the spacers 13) with RIE etching is performed.

At this point, the SAS process entails an additional SAS mask that is shown in FIG. 6 and designated by the reference numeral 17, to open only the source line regions (which are still not open with this process, differently from the standard process).

The SAS mask 17 is then arranged approximately halfway between the two word lines 16, allowing to provide the opening in the resist and to remove the field oxide bands 14 in the source line 18.

The areas of the source line that have thus been exposed are doped at this point by ion implantation.

FIG. 8 is a plan view of the final structure of the cell, executed by means of the SAS process, inserted in the matrix of an EPROM memory. In this figure, the reference numeral 18 designates the source line, the reference numeral 15 designates the active drain area, and the reference numeral 30 designates the metal bit line.

By means of the SAS process it is thus possible to remove the oxide spacers on the source line side.

FIG. 7 is a sectional view of memory cells in which the spacers are removed selectively, by means of the SAS matrix, from the word lines 16, on the side of the sources 18.

Although the SAS technique is advantageous with respect to the execution of a memory cell with the standard process, the cell thus formed has the drawback that it still has spacers on the drain side.

A principal aim of the present invention is therefore to provide a method for improving the intermediate dielectric profile that allows a reduction in the problems related to the deposition of the metal contact layers.

Within the scope of this aim, an object of the present invention is to provide a method for improving the intermediate dielectric profile so as to reduce the elevation differences of the devices, accordingly avoiding the danger of a reduction in the thickness of the layers that are deposited subsequently (metal layers for connection and final passivation).

Another object of the present invention is to provide a method for improving the intermediate dielectric profile that can be applied to memory cells produced both with the standard process and with the SAS (Self Align Source) process.

Another object of the present invention is to provide a method for improving the intermediate dielectric profile that allows, at the same time, to reduce a step for heavy source/drain ion implantation in the memory matrix.

Another object of the present invention is to provide a method for improving the intermediate dielectric profile that at the same time allows to eliminate the problems linked to the possible misalignment of the contacts and to the consequent reduction in the width of the field oxide, with insulation problems.

Another object of the present invention is to provide a method that is highly reliable and relatively easy to perform at competitive costs.

SUMMARY OF THE INVENTION

This aim, these objects, and others which will become apparent hereinafter are achieved by a method for improving the intermediate dielectric profile, particularly for non-volatile memories constituted by a plurality of cells, which comprises the following steps:

forming field oxide and drain active area regions on a substrate;

forming word lines on said field oxide regions;

depositing oxide to form oxide wings that are adjacent to said word lines;

opening, by masking, source regions and said drain active area regions, keeping the field oxide regions that separate one memory cell from the next, inside said memory, covered with resist; and removing field oxide in the source regions and removing the oxide wings from both sides of said word lines.

BRIEF DESCRIPTION OF THE DRAWINGS

Further characteristics and advantages of the invention will become apparent from the description of a preferred but not exclusive embodiment of the method according to the invention, illustrated only by way of non-limitative example in the accompanying drawings, wherein.

DETAILED DESCRIPTION

With reference to FIGS. 9, 10, 11a, and 11b, the method according to the invention is as follows.

Figure 1:
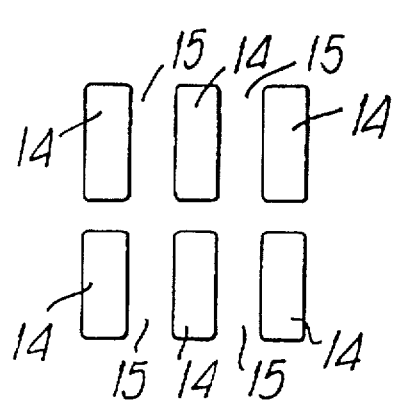
FIG. 1 is a view of a first process step for providing memory cells according to a first conventional method.
Figure 2:
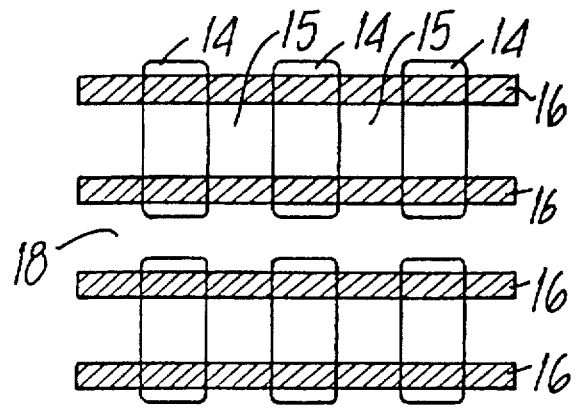
FIG. 2 is a view of a second process step for forming memory cells according to a first conventional method.

If the standard technique for forming memory cells is used, described previously in detail in FIGS. 1 and 2 for the first steps, the method according to the invention entails the use of an additional mask to eliminate the oxide spacers 13 from both the drain side and the source side of the memory cell.

Figure 9:
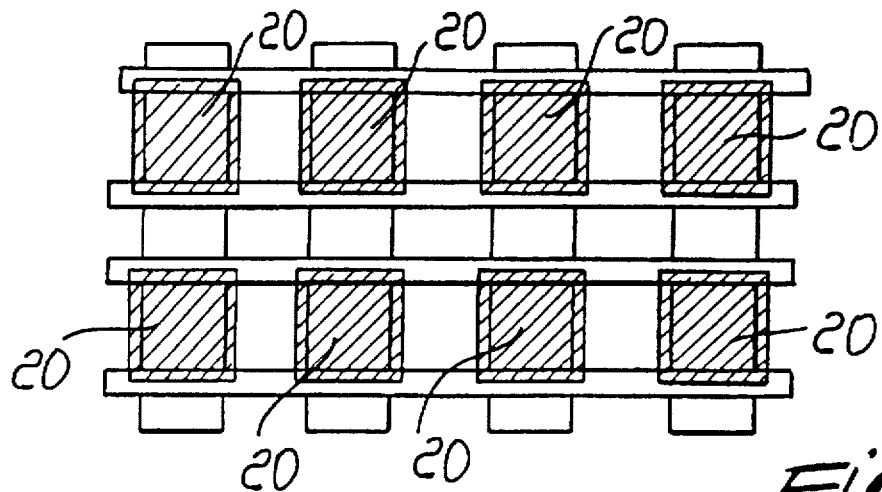
FIG. 9 is a view of the mask used in the method according to the invention for forming memory cells.

In particular, after the step for forming the word lines 16 (see FIG. 2), and after forming the oxide spacers, a particular mask, designated by the reference numeral 20 in FIG. 9, is used which allows simultaneous opening of the source and drain regions of the cells, covering the remaining portion of the device.

In this manner, it is possible to open the drain and source areas, leaving the field oxide region that separates the various cells from one another (i.e., separates the respective drains) covered with resist. Subsequent oxide etching allows removal of the field oxide in the source and to eliminate the oxide spacers from both sides of the word line 16. The oxide spacers 13 of the transistors of the circuitry instead remain unchanged.

Figure 10:
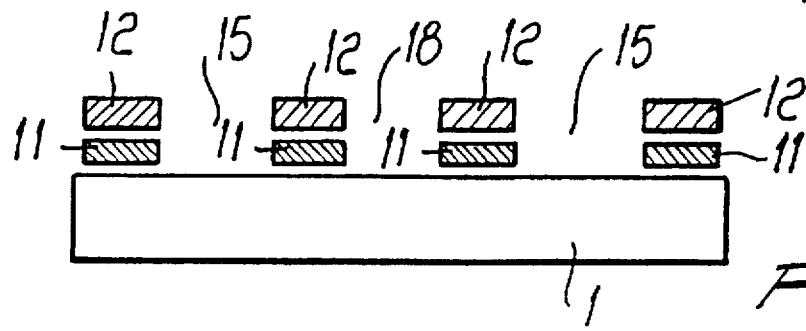
FIG. 10 is a sectional view of memory cells executed by means of the method according to the invention.

Therefore, a configuration such as the one shown in FIG. 10 is obtained, wherein the absence of the oxide spacers 13 is evident.

Figure 7:
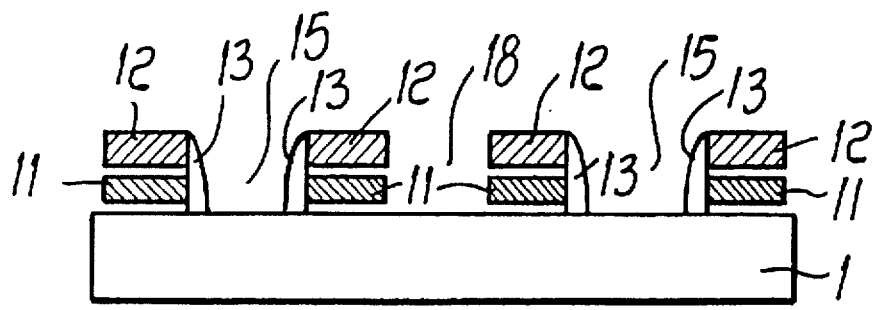
FIG. 7 is a sectional view of memory cells executed by means of the SAS technique of a known type.
Figure 8:
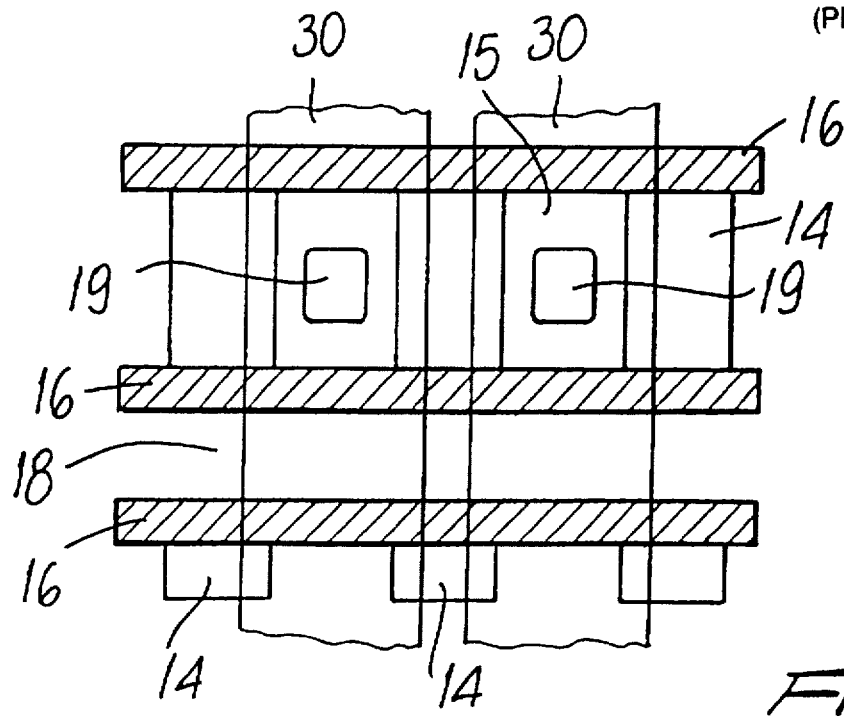
FIG. 8 is a plan view of the final structure of a cell formed with the SAS technique of a known type, inserted in the matrix of an EPROM memory.

Comparison of FIG. 10 with FIG. 7, which relates to cells formed by means of the above-mentioned SAS technique, illustrates the difference in result allowed by the use of the mask 20 used in the method according to the invention with respect to the mask 17 used in the SAS technique.

In the first case, the oxide spacers 13 are removed both from the source side and from the drain side of the cell, whereas in the second case the spacers 13 are removed selectively only from the drain side.

Figure 11A:
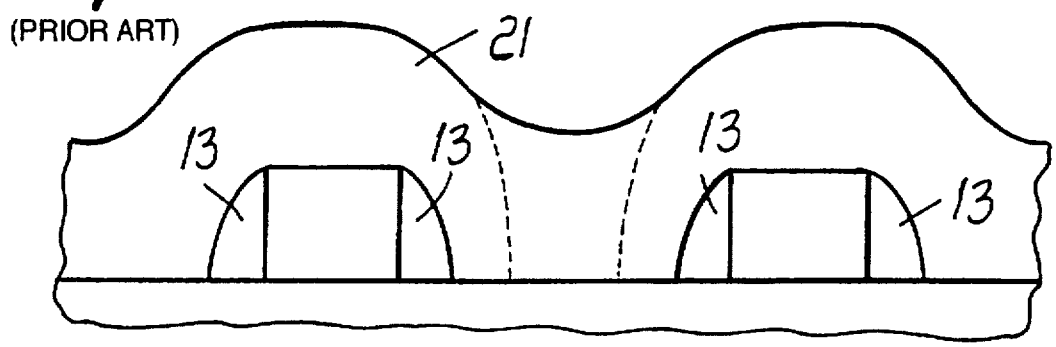
FIG. 11a is a sectional view of a pair of memory cells executed by means of the first known method.
Figure 11B:
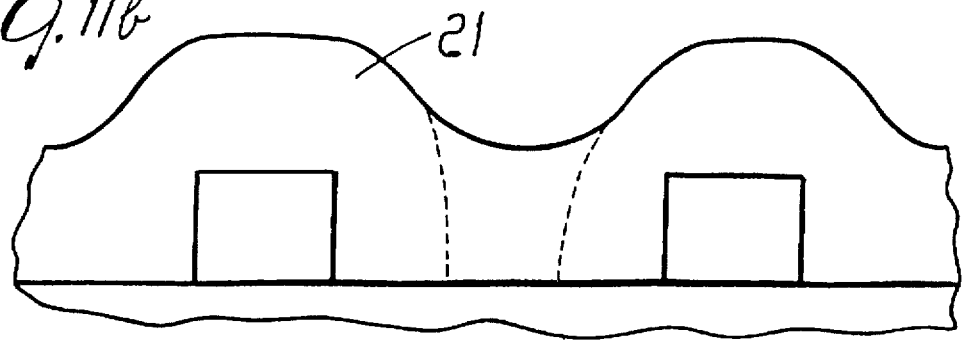
FIG. 11b is a sectional view of a pair of memory cells executed with the method according to the invention.

FIG. 11b shows the effect of the removal of the spacers 13 from the drain and source sides of the cell and of the consequent freeing of volume proximate to the gate of the cell.

Accordingly, the volume that is freed allows redistribution of the intermediate dielectric 21, with a reduction in elevation differences and a better execution of the contacts. Comparison with FIG. 11a clarifies this concept.

The presence of the spacers 13 in fact widens the structure of the word line 16, entailing an unfavorable situation for contact opening.

The complete removal of the spacers 13 of the cell formed by means of the method according to the invention allows to eliminate a step that precedes the formation of said spacers.

Figure 3:
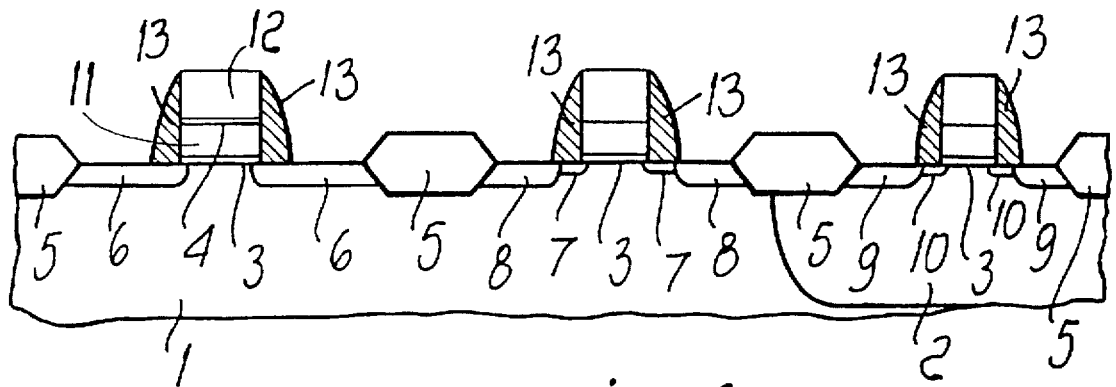
FIG. 3 is a sectional view of a memory cell, of an N-channel transistor, and of a P-channel transistor, all of which are on the same substrate and are formed by means of the first conventional method.
Figure 4:
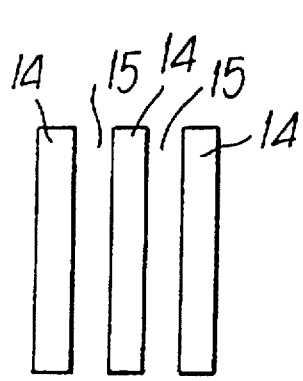
FIG. 4 is a view of a first process step for forming memory cells by means of the SAS technique of a known type.
Figure 5:
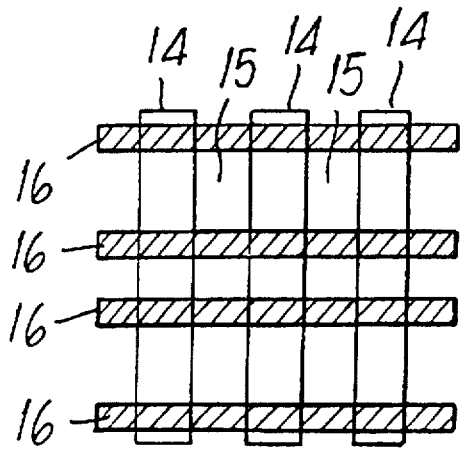
FIG. 5 is a view of a second process step for forming memory cells by means of the SAS technique of a known type.
Figure 6:
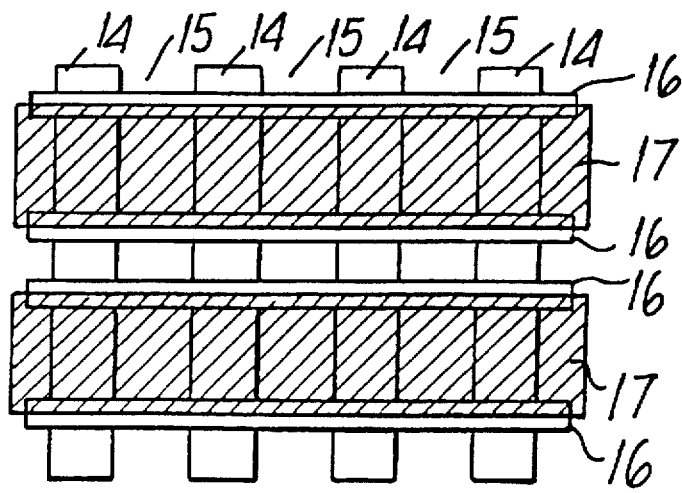
FIG. 6 is a view of a third process step for forming memory cells by means of the SAS technique of a known type.

In fact, the implantation of the self-aligned junction 6 (shown in FIG. 3) for the memory cell is performed, according to the conventional techniques (the traditional and the SAS techniques), before forming the oxide spacers, since this junction must be self-aligned with the gate 11 of the cell (see FIG. 3) and thus formed in a position lying below every single spacer 13.

The implantation for the junction 6 that is self-aligned to the gate 11 of the cell is of the same type as the source/drain implantations 8 and 9 for the transistors of the circuitry (heavy source/drain implantation), which is however provided so that it is self-aligned with the spacer 13.

Because of these differences in self-alignment, it is evident that with conventional techniques it is necessary to perform two different implantations for the self-aligned junction 6 of the memory cell and for the source/drain junctions 8 and 9 of the transistors of the circuitry (of the N type).

With the method according to the invention, which uses the mask 20 to achieve removal of the oxide spacers 13 from the sides of the cell, it is possible to eliminate a step for the heavy source/drain implantation of the matrix, which is self-aligned with the gate of the cell, since said step can be performed subsequently with the heavy source/drain implantations 8 and 9 of the transistors of the circuitry. This is due to the fact that the spacers 13 are removed from the sides of the gate of the cell.

This heavy implantation step is performed with an N+ mask that is appropriately modified with respect to the mask used in conventional techniques, so as to open and thus dope not just the traditional active areas of the N-channel transistors of the circuitry and of the decoding system, but also the entire surface of the memory matrix. In this manner, heavy source/drain implantation is performed for the transistors and for the cells of the matrix in a single step.

It is thus clear that in the case of the standard technique for forming the matrix cells, introducing the masking step performed by means of the mask 20 in the process flow entails an additional step for the conventional technique, which is however abundantly compensated by the advantages achieved by the elimination of the oxide spacers 13 (redistribution of the intermediate dielectric) and by the possibility of eliminating a step of heavy source/drain implantation for the matrix cells.

If the technique with the SAS mask 17 is used instead of the standard technique, in order to implement the method according to the invention a mask (the mask 17) that is already necessarily used is modified, so as to obtain the mask 20 of the method according to the invention. In this manner, no masks are added.

This modification of the mask 17 for the source/drain implantation of the N-channel transistors of the circuitry and of the decoding system (a mask that is present in any case) allows to simultaneously provide the source/drain implantation for the memory cells as well, thus always eliminating a process step.

In practice, it has been observed that the method according to the invention fully achieves the intended aim, since it allows elimination the oxide wings (spacers) at the sides of the gates of the memory cells, i.e., on the source side and on the drain side, allowing an improvement in the distribution of the intermediate dielectric, with a consequent reduction in elevation differences and an improvement in contact formation.

Furthermore, with the method according to the invention, which can be applied both to cells executed in a standard manner and to cells executed with SAS technology, it is possible to eliminate from the process a heavy source/drain implantation step for the matrix cells, performing it directly at the same time as the drain/source implantation of the N-channel transistors.

The method thus conceived is susceptible of numerous modifications and variations, all of which are within the scope of the inventive concept.

Figure 12:
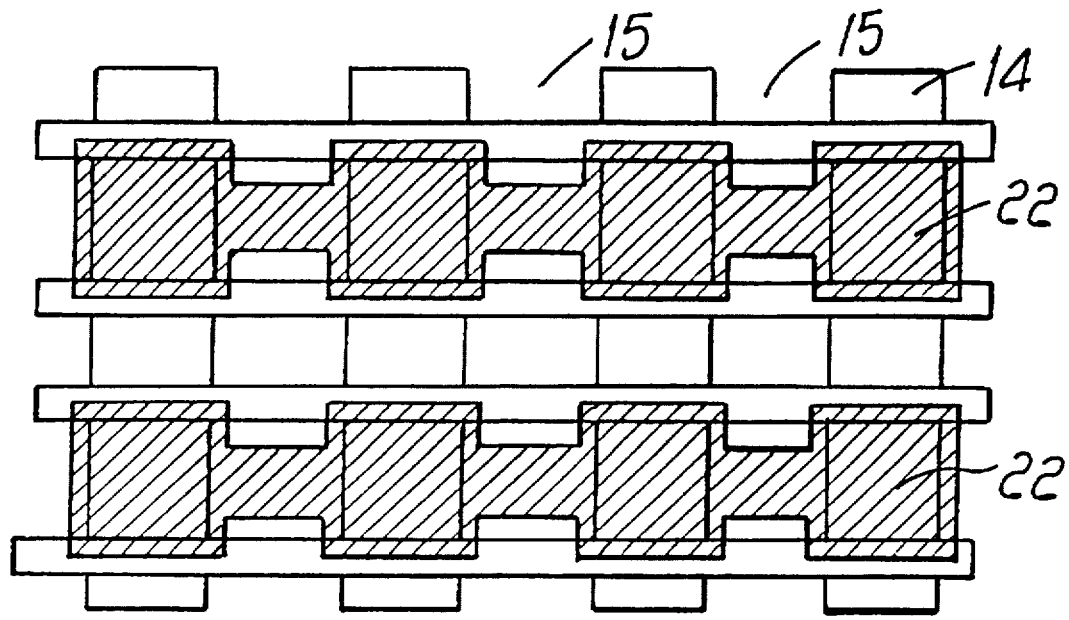
FIG. 12 is a view of a second embodiment of the mask shown in FIG. 9 and used in the method according to the invention.

Thus, for example, the mask 20 used in the method according to the invention and shown in FIG. 9 can be replaced with the mask 22 shown in FIG. 12. In this case, the mask 22 being used also covers the drain contact region, so as to mask the source/drain implantation.

This allows to keep a constant distance between one drain contact and the next on the same word line 16, since the distance of the two source/drain wells is defined by the contact implantation.

In this manner the problems linked to the size and alignment of the contact line are eliminated, which in case of misalignment can reduce the width of the field oxide in the matrix. In case of misalignment of the contacts, the width of the field oxide is in fact determined on one hand by the contact implantation and on the other hand by the source/drain well.

The configuration of the mask 22 shown in FIG. 12 furthermore has the advantage that it gives greater strength to the resist portions left on the matrix by the mask. Said resist portions are in fact linked to each other in this manner, thus obviating lifting problems.

Figure 13:
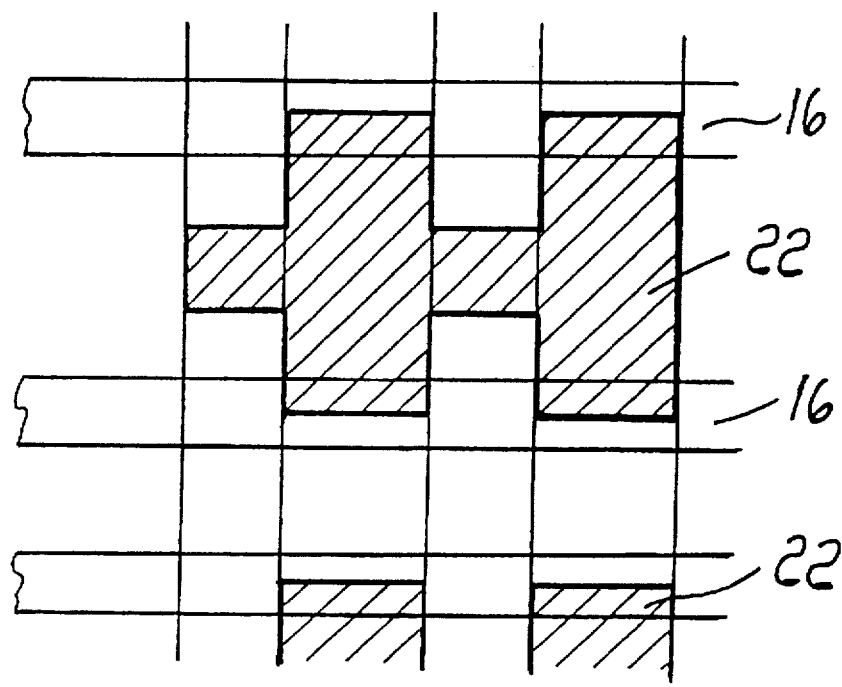
FIG. 13 is a view of the plan configuration of a portion of a memory matrix executed with the mask of FIG. 12, according to the invention.

FIG. 13 is a plan view of a portion of a matrix with the mask 22 according to a second embodiment of the method according to the invention.

This second embodiment of the mask used in the method according to the invention can be used in all those cases in which the dimensional tolerances allowed to any of the above-described misalignment phenomena are very small, for example in the case of small-size memories. On the contrary, if the size tolerances are greater, it is sufficient to use the mask shown in FIG. 9.

With appropriate process and configuration changes it is possible to use the method and the mask according to the invention to improve the dielectric profiles for the transistors of the circuitry as well.

Finally, all the details may be replaced with other technically equivalent elements.

In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for improving an intermediate dielectric profile, particularly for non-volatile memories constituted by a plurality of cells, comprising the steps of:
   - forming field oxide regions and drain active area regions on a substrate;
   - forming word lines on said field oxide regions;
   - depositing oxide to form oxide wings that are adjacent to said word lines;
   - opening, by masking, source regions and said drain active area regions, keeping the field oxide regions that separate one memory cell from the next memory cell, inside said memories, covered with resist; and
   - removing field oxide in the source regions and removing the oxide wings from both sides of said word lines.

2. A method according to claim 1, further comprising the additional step of performing, by masking, a heavy source and drain implantation both for said cells and for N-channel transistors of the decoding system and of the circuitry.

3. A method according to claim 1, wherein said step for opening said source regions and drain active regions is performed by means of a mask that is arranged at said field oxide regions, halfway between one word line and the next word line, said mask being adapted to allow the opening of source regions and of drain active area regions, said mask allowing to keep the field oxide regions between one memory cell and the next memory cell covered with said resist.

4. A method according to claim 3, wherein said mask is a self-aligned source mask, modified to allow the opening, in a single step, of said source regions and said drain active area regions, keeping the field oxide regions between the drain terminals of one memory cell and the drain terminals of an adjacent memory cell covered with said resist.

5. A method according to claim 3, wherein said mask is adapted to partially also cover said drain active area regions at the drain contact of each of said memory cell.

* * * * *